United States Patent [19]

Ancona

[11] Patent Number: 4,978,928
[45] Date of Patent: Dec. 18, 1990

[54] HIGH FREQUENCY, FREQUENCY MULTIPLIER USING PARALLEL GUNN DIODES

[75] Inventor: Mario Ancona, Alexandria, Va.

[73] Assignee: The United States of America as represented by the Secretary of the Navy, Washington, D.C.

[21] Appl. No.: 501,571

[22] Filed: Mar. 30, 1990

[51] Int. Cl.⁵ ............................................. H03B 5/12
[52] U.S. Cl. ............................................. 331/107 G
[58] Field of Search ........................ 331/107 G; 357/3

[56] References Cited

U.S. PATENT DOCUMENTS 3,365,583  1/1968  Gunn ........................ 331/107 G X
3,624,556  11/1971  Copeland ........................ 331/107 G Primary Examiner—Robert J. Pascal
Attorney, Agent, or Firm—Thomas E. McDonnell

[57] ABSTRACT

A Gunn oscillator having a plurality of Gunn elements connected in parallel between a common anode and a common cathode. In one embodiment, the elements are separated by barrier layers that capacitively couple domain fields into adjacent elements thereby sequentially triggering them. There is a time delay between the domain formation in one element and the domain formation in the next. Another embodiment has elements of differing lengths to establish differing threshold voltages for triggering domains in each element. Sequentially triggering domain formation, e.g., by a simple sawtooth voltage, creates domains within each element. Again, there is a time delay between the domain formations in the elements. In either embodiment, collection of the domains at the common anode results in multiplication of the oscillator's base frequency.

10 Claims, 2 Drawing Sheets

HIGH FREQUENCY, FREQUENCY MULTIPLIER USING PARALLEL GUNN DIODES

BACKGROUND OF THE INVENTION

This invention relates to high frequency Gunn effect oscillators.

As shown by Gunn in U.S. Pat. No. 3,365,583, f, the primary mode oscillating frequency of a Gunn effect diode is given by $f=v/L$, where v is the drift velocity of the electrons and L is the length of the diode in the direction of current flow. Thus, the physical length of the diode limits the oscillating frequency of a conventional Gunn-effect oscillator.

There is a long standing desire to improve the operating characteristics of Gunn-effect oscillators. One area of study has been to increase the oscillating frequency; the primary method for increasing the oscillating frequency is reducing the diode length. However, below some minimum length further reductions are ineffective because sufficient length is required for the Gunn instability to act, i.e., for carrier heating and inter-valley transfer to occur. Conventional Gunn-effect diodes of doped Gallium Arsenide can be made to oscillate at frequencies up to 100 GHz. Improvement has also been sought in the signal power available from an oscillator.

SUMMARY OF THE INVENTION

Accordingly, an object of this invention is to increase the frequency of a Gunn effect oscillator by at least an integer factor.

Another object of the invention is to do this without decreasing the length of the Gunn diode used in the oscillator.

Another object of the invention is to increase the signal power that a single oscillator can deliver at high frequencies.

In its broadest form, the invention is a Gunn-effect frequency multiplier having a plurality of semiconducting elements capable of supporting Gunn-effect domains; a cathode and an anode, common to all said semiconducting elements, connecting said elements in parallel; and means for sequentially creating a dipole domain in each of said semiconducting elements during a time substantially less than or equal to the shortest transit time of a dipole domain between said cathode and said anode for any of said semiconducting elements. The combined output from all of the diodes will appear as a sequence of pulses at a common anode: the frequency of the individual diodes is multiplied by the number of diodes in parallel. Because the quantity of diodes affects the oscillator's frequency, the frequency is increased without decreasing the length of the individual diodes. Also, because each pulse is delivered by a different diode, power available from the oscillator is increased without increasing the required current through the individual diodes.

In one embodiment, the semiconducting elements are capacitively coupled, so that a domain created in one element causes the creation of a domain in the next adjacent element, and so on throughout the device. Because of the capacitive coupling, there is a time lag between one domain, and the domain in the next adjacent layer, this lag being the period of oscillation.

In another embodiment the elements are of sequentially increasing length, and thus each element requires a sequentially greater voltage to trigger domain formation. A ramp voltage of appropriate magnitude applied across the elements in parallel will sequentially reach the critical value for domain formation in each element, sequentially creating a domain in each element.

Other objects, advantages, and novel features of the invention will become apparent from the following detailed description of the invention when considered in conjunction with the accompanying drawings; wherein:

BRIEF DESCRIPTION OF THE DRAWINGS

FIG. 1 is not to scale.

DESCRIPTION OF THE PREFERRED EMBODIMENT

Figure 1:
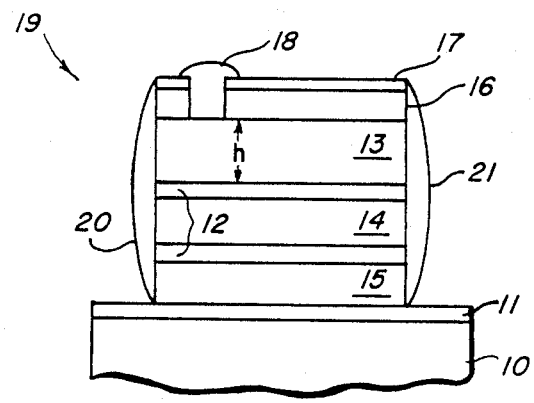
FIG. 1 is an elevational view of one embodiment of the invention; as with each drawing Figure.

Referring to the drawing figures, like references denoting like members throughout the several views, and in particular to FIG. 1 where a device according to the invention is shown. There is shown a substrate 10 covered by buffer layer 11 onto which are disposed undoped, or otherwise semi-insulating, Gallium Aluminum Arsenide (GaAlAs) barrier layers 12 separating conducting, doped Gallium Arsenide (n-GaAs) layers 13, 14, 15. Layers 12, 13, 14, 15 form mesa 19. Electrical contacts 20, 21 simultaneously contact all the semiconducting layers thereby electrically connecting layers 13, 14, 15 in parallel. Top n-GaAs layer 13 has a gate contact 18 near one of the two end contacts 20 or 21. The end contact close to gate 18 is the cathode (here 20); the remote end cOntact is the anode (here 21). Additional barrier layer 16 provides symmetry by covering conducting layer 13; layer 16 is in turn covered by fully depleted, doped layer 17, the latter being of sufficient thickness to screen underlYing layer 13 from the surface depletion region.

Thickness h of conducting layers 13, 14, 15 is chosen to be as small as possible consistent with the need to support Gunn domains. This minimal thickness creates stronger edge effects, thus improving capacitive coupling between these conducting layers. Doping for conducting layers 13, 14, 15 is chosen to be as low as possible consistent with the need to support Gunn oscillations. Lower doping levels increase the size of the Gunn domain thereby improving alignment between domains in adjacent layers. One skilled in the art of fabricating Gunn devices can determine the dimensions and doping for this device once this disclosure instructs him of the reasons for so doing. Example values are a conduction layer thickness of 0.5 $\mu$m, with doping of $2\times10^{16}$/cm$^3$. Barrier layers 12 should be thick enough to prevent significant electrical conduction between layers yet thin enough so that neighboring conducting layers 13, 14, 15 have strong capacitive coupling. A thickness of roughly 20 nm is reasonable. Consistent with fabrication requirements, the Al mole fraction should be as high as possible to maximize the band offsets between the n-GaAs and GaAlAs and thereby improve isolation between conducting layers 13, 14, 15. Example values for the thickness of barrier layer 16 and surface layer 17 are 20 nm and 15 nm respectively and a doping in layer 17 of $1 \times 10^{17}/cm^3$. Layer 17 is fully depleted to prevent its becoming a parasitic channel.

In operation, top conducting layer 13 behaves in a manner analogous to a conventional gated Gunn diode. Bias voltage applied to cathode 20 raises the electric field in parallel conducting layers 13, 14, 15 near, but below, the Gunn threshold electric field $E_p$. A voltage pulse applied to gate contact 18 makes the local field strength exceed $E_p$; this initiates a Gunn instability and a dipole domain begins forming in layer 13 near cathode 20. Within several picoseconds a mature dipole domain forms and begins propagating down the length of layer 13. An output pulse develops when the dipole domain is extinguished at anode 21.

In a conventional Gunn device, once domain formation initiates it will rapidly fill the entire width of the device because the entire device is conducting material. In contrast, this structure isolates adjacent conducting layers 13, 14, 15 with barriers 12 which prevent the instability from filling all of the layers with a single domain. However, barrier layers 12 capacitively couple adjacent conducting layers 13, 14, 15. When domain formation initiates in gated layer 13 it creates a charge dipole in that layer which is capacitively coupled to layer 14. The coupled field is sufficient, when added to the field very close to $E_p$ resulting from the bias voltage, to exceed $E_p$ thus initiating domain formation in conducting layer 14. Similarly, the domain forming in layer 14 is capacitively coupled to layer 15 initiating domain formation in layer 15.

Figure 2:
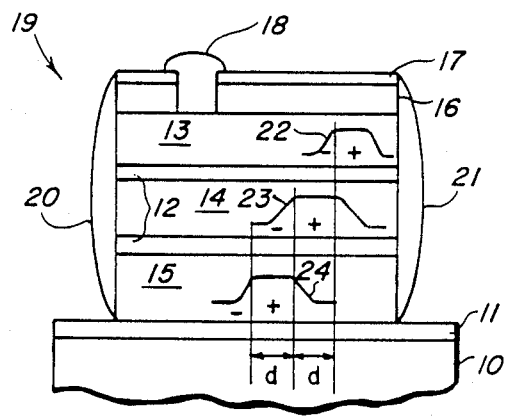
FIG. 2 is a view similar to FIG. 1 showing the spatial relationships among the domains for the device of FIG. 1.

FIG. 2 illustrates the sequential domain formation and, in particular, shows the conditions within the device of FIG. 1 after domain 24 in bottom layer 15 matures but before domain 21 in gated layer 13 is extinguished. Because domain 23 takes time to form in layer 14, and because domain 22 is in transit towards anode 21 while domain 23 is forming in layer 14, there is a time lag between domains 22 and 23. The time required for one domain to trigger a second domain is several picoseconds in the embodiment of FIG. 1. Domain dipoles 22, 23, 24 line up because of the combined effect of their order of creation, the substantially fixed time lag between their initiations, the substantially equal speed of domain propagation within the layers (i.e., the drift velocity of the charge carriers in the n-GaAs layers), and the electrostatic coupling between positive and negative portions of dipoles 22, 23, 24. The result is that domains align into fixed relative positions staggered on a roughly fixed interval d.

Figure 3:
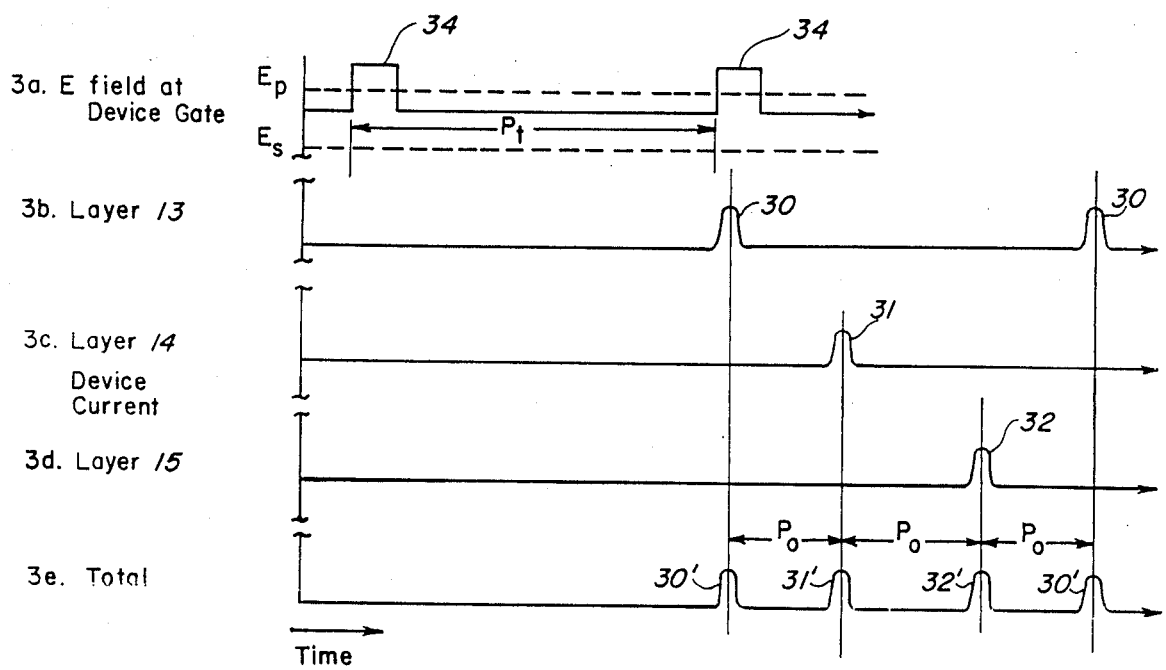
FIGS. 3 (a) to (e) show the timing relationships among the domains for the device of FIGURE 1.

FIG. 3 shows the pulse timing for the embodiment shown in FIG. 1 and FIG. 2. FIG. 3a shows electric field E from two consecutive trigger pulses 34 applied to layer 13 via gate 18. Trigger pulses 34 preferably arrive at a frequency roughly equal to the free running frequency of layer 13. FIG. 3b shows anode current pulse 30 from layer 13 resulting from trigger pulse 34. Because trigger pulse 34 is at a frequency roughly equal to the free running frequency of layer 13, and because of the domain's transit time in layer 13, pulse 30 lags behind trigger pulse 34 by a time approximately equal to the period $P_t$ of trigger pulse 34. FIG. 3c and FIG. 3d show output current pulses 31 and 32 for layers 14 and 15 respectively. Pulse 31 from layer 14 develops at anode 21 after output pulse 30 from layer 13 because of the combined effects of the time required to capacitively couple the domain field from layer 13 and the time to form a domain within layer 14. Output pulse 32 from layer 15 is similarly delayed from pulse 31. FIG. 3e shows output at anode 21, i.e., pulses 30, 31, 32 from parallel layers 13, 14, 15 combine at common anode 21 to provide three output pulses 30', 31', 32' for each input pulse 34: thus, the input frequency is multiplied by three, the number of coupled layers. Because the device length is the same for each layer, roughly fixed interval d causes output pulses 30', 31', 32' to cycle on roughly equal period $P_0$. If the number of layers, n, their length, L, the input frequency, $f_I$, and the desired output frequency, $f^o$, are selected such that $f_1 = f_o/n$ and $L \approx nd$, then the output pulse sequence at the anode can be made continuous.

This invention may be carried out using any semiconductor material capable of sustaining Gunn-effect oscillations and any barrier material with a wider band gap. Because Gallium-Arsenide (GaAs) and Gallium-Aluminum-Arsenide (GaAlAs) are well known materials capable of high frequency Gunn effect oscillations, the embodiments are described in terms of GaAs and GaAlAs. Other semiconductors having fast drift velocities and thus inherently greater oscillation frequencies, such as other III–IV semiconductors, and especially Indium-Phosphide (InP), are also desirable. At the higher frequencies of which this device is capable, it may be advantageous to provide more uniform domain formation by moving the domain formation site away from the metal contacts. Notching the device transverse to layers 13, 14, 15 reduces the conducting region in each layer, causing the development of high local fields around the notch. Domain initiation will occur in the higher strength field around the notch rather than at the cathode contact, permitting a designer to choose the place in each layer where domains will form.

Figure 4:
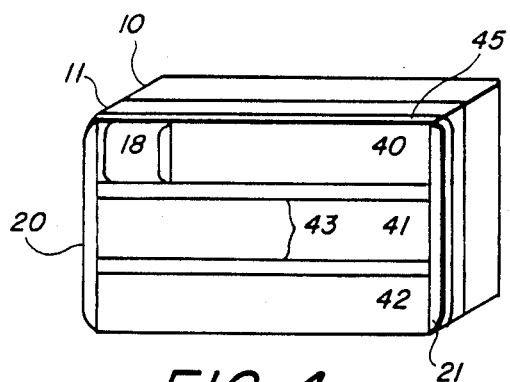
FIG. 4 is an elevational view of another embodiment of the invention.

FIG. 4 shows another embodiment of this invention with a plurality of coplanar semiconducting channels 40, 41, 42 rather than layers in a stack of parallel planes. Substrate 10 is covered by buffer layer 11 and conducting n-GaAs layer 45. Etched or implanted barriers 43 isolate closely spaced, surface channels 40, 41, 42 within conducting layer 45. Channel 40 has gate 18 to apply a triggering signal. Cathode 20 and anode 21 connect channels 40, 41, 42 in parallel. Screening conducting layer 45 from the surface depletion region is not required because all channels will have the same narrowing due to the surface depletion region; thus, layers 16 and 17 are not required.

In operation, channel 40 behaves in a manner analogous to a conventional gated Gunn diode. Bias voltage applied to cathode 20 raises the electric field in parallel channels 40, 41, 42 near, but below, the Gunn threshold $E_p$. A pulse applied to gate 18 initiates domain formation in channel 40. The domain is coupled across barrier 43 and summed with the local field, developed within channel 41 by the bias, causing the local field to exceed $E_p$. A domain is initiated in channel 41. In a similar manner, the fields from the domain forming in channel 41 are coupled into and summed with the bias field within channel 42 initiating a domain in channel 42. Thereafter, these domains are collected at anode 21, as in the embodiment of FIGS. 1–2.

The planar embodiment of FIG. 4 with its single conducting layer 45 allows parallel heat transfer into a heat sink (not shown) thereby allowing higher power outputs.

Figure 5:
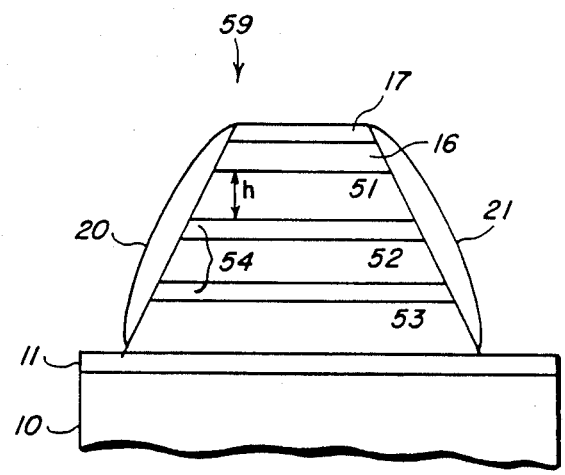
FIG. 5 is an elevational view of another embodiment of the invention.

FIG. 5 shows an embodiment without capacitive coupling where each semiconducting layer 51, 52, 53 has a different length, thus causing each layer to require a different voltage before it establishes Gunn threshold field E . Substrate 10 is covered by buffer layer 11 on which is disposed undoped GaAlAs, or otherwise semi-insulating, barrier layers 54 separating conducting n-GaAs layers 51, 52, 53. Additional barrier layer 16 provides symmetry by covering layer 51; layer 16 is in turn covered by fully depleted doped layer 17 of sufficient thickness to screen underlying layer 51 from the surface depletion region. Layers 51, 52, 53, 54 form mesa 59 with angled end walls. Electrical contacts 20 and 21 simultaneously contact all semiconducting layers thereby electrically connecting conducting layers 51, 52, 53 in parallel. One end contact is the cathode (here 20); the other end contact is the anode (here 21).

In this embodiment thickness h of conducting layers 51, 52, 53 is chosen solely on the basis of fabrication requirements and the need to support Gunn domains. Reasonable values are a thickness of 0.5 µm and a doping of $2 \times 10^{16}/cm^3$. Increasing the Al mole fraction in GaAlAs barrier layers 54 increases the band offset and improves isolation between conducting layers 51, 52, 53. Barrier layers 54 must be thick enough to prevent significant electrical conduction or coupling between conducting layers 51, 52, 53. A thickness of 50 nm is reasonable.

The angled ends of mesa 59 cause each successive layer to be longer than the layer above it. The difference in length of the conducting layers 51, 52, 53 has two major effects: (a) the voltage required to establish $E_p$ increases with the length of the layer; and (b) the distance that the domain must transit increases with the length of the layer. These effects operate in the same direction: the earliest domains to form are in the shortest layers and domains in these layers have less length to transit. If the thicknesses of conducting layers 51, 52, 53 are equal and if the thicknesses of barrier layers 54 are equal, then there will be a fixed incremental difference in the length of any two adjacent conducting layers. This fixed incremental length generates a fixed increment, in the voltage required to establish $E_p$, from one of layer 51, 52, 53 to the next adjacent layer. If a linear Voltage ramp is applied to cathode 20, layers 51, 52, 53 trigger in the order of their size, shortest first, longest last. The result is a fixed incremental time between domain initiations in adjacent layers.

In operation, individual semiconducting layers 51, 52, 53 each behave in a manner analogous to conventional Gunn diodes. Because barrier layers 54 are thick enough to prevent strong capacitive coupling, there is no coupling of domains from adjacent layers as in the capacitively coupled embodiments. Instead, domain formation is initiated independently in layers 51, 52, 53 when the applied voltage causes the field within each layer to exceed $E_p$.

Coupling between layers 51, 52, 53 would cause an out of sequence pulse by triggering early domain formation in an adjacent layer. The longer a layer is, the greater the applied voltage must be before $E_p$ is exceeded. All the domains that have been initiated are in transit while the voltage ramp increases to a value such that the sum of the developed field and any coupled field would exceed $E_p$. Thus, if domains are coupled between layers, the resulting domain would form part way along the length of the longer layer and the length that that domain must transit is shortened. Since coupling between layers is undesirable in this embodiment, barrier layers 54 must be thick enough to reduce capacitive coupling so that coupled fields are too weak to trigger domain formation.

Figure 6:
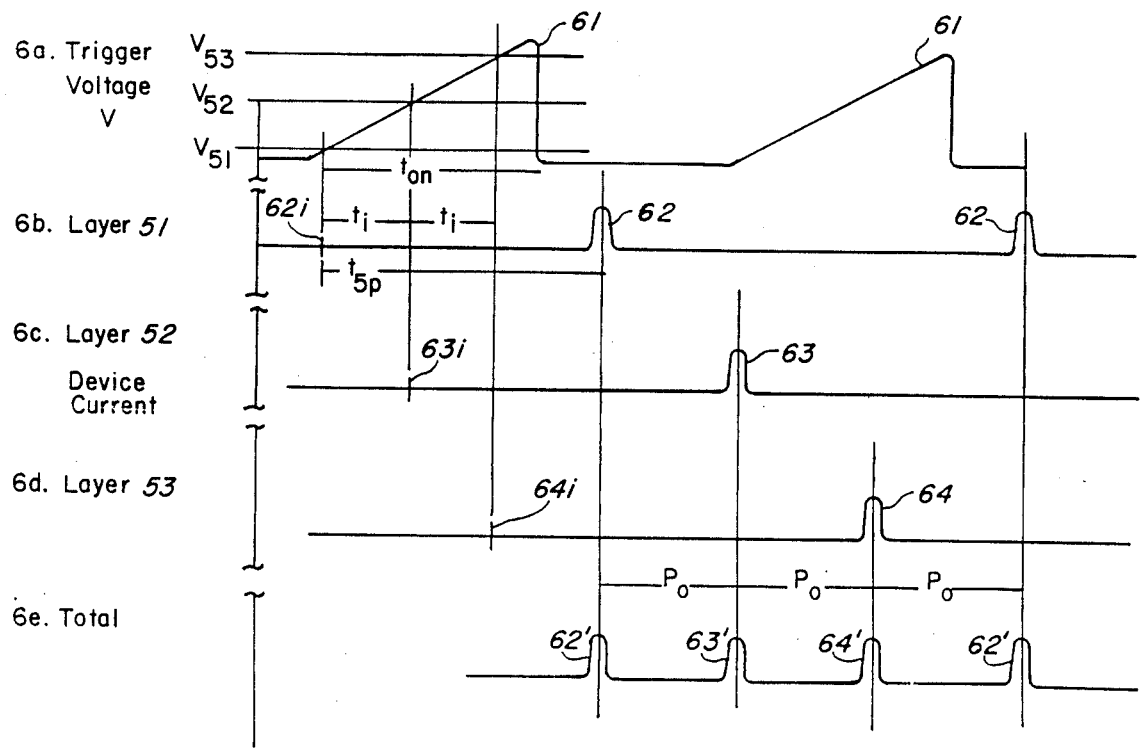
FIG. 6(a) to 6(e) show the timing relationships among the domains for the device of FIG. 5.

FIG. 6 shows the pulse timing of the semiconductor layers for the embodiment shown in FIG. 5 responsive to a sawtooth trigger voltage 61 (FIG. 6a) of duration $t_{on}$ applied across common cathode 20 and common anode 21. FIG. 6b shows current output pulse 62 for layer 51. FIGS. 6c and 6d show current output pulses 63, 64 for layers 52 and 53, respectively. If trigger ramp 61 is linear, $V_{51}$, $V_{52}$, $V_{53}$, the equally spaced voltages at which $E_p$ is reached in layers 51, 52, 53 respectively, cause the domains that generate pulses 62, 63, 64 to be initiated after equal time lags $t_l$. Domain initiation at time 63i lags behind domain initiation at time 62i by time increment $t_l$. FIG. 6d similarly shows that domain initiation at time 64i lags behind initiation 63i. The transit time for each layer differs due to the difference in length. The time lag between domain initiation and the difference in transit time sum to the difference in output pulse arrival time $P_0$, which is the period of oscillation for the device of FIG. 5. FIG. 6e shows that output pulses 62, 63, 64 from parallel layers 51, 52, 53 combine at common anode 21 to provide three output pulses 62', 63', 64' for each input ramp 61: the input frequency is multiplied by three, the number of parallel layers. The critical timing factor is that duration $t_{on}$ of sawtooth trigger pulse 61 must be shorter than transit time $t_{51}$ of layer 51, the shortest layer. Otherwise, when layer 51 becomes domain free, its field would still exceed $E_p$ and an out of sequence domain would form. FIG. 6e also shows that output pulse sequence 62', 63', 64' can be made continuous by applying a sawtooth trigger voltage 61 at the proper frequency, roughly the frequency of the longest layer 53.

Because thicker barrier layers 54 diminish capacitive coupling between adjacent layers, the uniformity of the delay between output pulses 62', 63', 64' will depend upon the uniformity of the material within and among conducting layers 51, 52, 53, the uniformity of the incremental variation in length between the layers, the linearity of sawtooth trigger ramp 61, and on the impact on transit time of the change in drift velocity as the applied voltage V is ramped from $V < V_{51}$ to $V > V_{53}$. While the impact of the changing drift velocity is minimal, compensation for the impact can be achieved in manufacture by varying the thicknesses of each layer or, alternatively, in application by shaping trigger ramp 61 to be non-linear. Both compensations make incremental lag time $t_l$ non-uniform, thus offsetting unequal impacts on transit time among the layers caused by the changing drift velocity.

Figure 7:
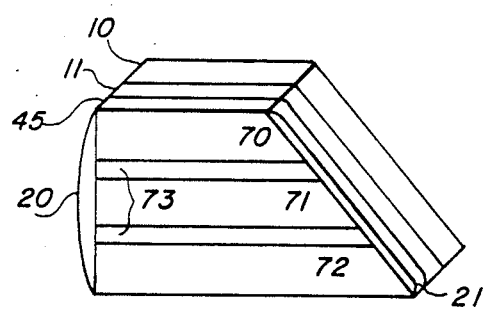
FIG. 7 is an elevational view of yet another embodiment of invention.

FIG. 7 shows another embodiment of this invention. There is shown a substrate 10 covered by buffer layer 11 onto which is disposed doped Gallium Arsenide (n-GaAs) layer 45. A plurality of closely spaced, coplanar, semiconducting, surface channels 70, 71, 72 are isolated by etched or implanted barriers 73 within layer 45. Cathode 20 and anode 21 connect channels 70, 71, 72 in parallel.

Operation of this embodiment is analogous to the embodiment of FIG. 5. Each successive channel is longer than the previous channel. The increasing length of channels 70, 71, 72 causes the voltage required to establish $E_p$ to increase with the length of that layer; the distance that each domain must transit also increases with the length of its layer. These effects operate in the same direction: the earliest domains to form are in the shortest layers and domains in these layers have less length to transit. If the widths of channels 70, 71, 72 are equal and if the widths of barriers 73 are equal, then there will be a fixed incremental difference in the length of any two adjacent channels. This fixed incremental length generates a fixed increment in the voltage required to establish $E_p$ from one of channel 70, 71, 72 to the next channel. If a linear voltage ramp is applied to cathode 20, the channels trigger in the order of their size, shortest first, longest last. The result is a fixed incremental time between domain initiations in adjacent channels.

In operation, individual channels 70, 71, 72 each behave in a manner analogous to conventional Gunn diodes. Because barriers 73 are thick enough to prevent strong capacitive coupling, there is no coupling of domains from adjacent channels. Instead, domain formation is initiated independently in channels 70, 71, 72 when the applied voltage causes the field within that channel to exceed $E_p$. Analogous to the device of FIG. 5, the domains are sequentially collected at the common anode and the input frequency is multiplied by three, the number of coplanar channels.

As in the planar embodiment of FIG. 4, this planar device allows parallel heat transfer to a heat sink, thus allowing a greater output power.

For the sake of clarity, the preferred embodiments have been limited to three Gunn effect layers or channels; two or more could be used. However, the number of layers, n, will be limited by the dimensions of the device; the number of layers and channels will also be limited by the need to constrain the device length to be a multiple of the offset between domains in adjacent layers.

Obviously many modifications and variations of the present invention are possible in light of the above teachings. It is therefore to be understood that within the scope of the appended claims the invention may be practiced otherwise than as specifically described.

I claim:

1. A Gunn-effect frequency multiplier device comprising:
   a plurality of semiconducting elements capable of supporting Gunn-effect domains;
   a cathode and an anode, common to all said semiconducting elements, connecting said elements in parallel; and
   means for sequentially creating a dipole domain in each of said semiconducting elements during a time substantially less than or equal to the shortest transit time of a dipole domain between said cathode and said anode for any of said semiconducting elements.

2. The device of claim 1 wherein said means for sequentially creating comprises capacitive coupling between said elements.

3. The device of claim 2 wherein said semiconducting elements are substantially coplanarly disposed.

4. The device of claim 2 wherein said semiconducting elements are a plurality of semiconducting layers isolated from adjacent semiconducting layers by barrier layers.

5. The device of claim 4 wherein one of said semiconducting layers has a gate adapted to admit a triggering voltage to initiate domain formation within that layer.

6. The device of claim 1 wherein said means for sequentially creating comprises a threshold means to establish a threshold electric field within each of said plurality of semiconducting elements sufficient to initiate domain formation, wherein said threshold electric field is established at a different voltage for each of said plurality of semiconducting elements.

7. The device of claim 6 wherein said threshold means is a difference in the length of each of said plurality of semiconducting elements.

8. The device in claim 7 wherein said semiconducting elements are surface channels within a single semiconducting layer.

9. The device in claim 7 wherein said semiconducting elements are a series of semiconducting layers isolated from adjacent semiconducting layers by barrier layers.

10. A Gunn-effect frequency multiplier comprising:
    a plurality of semiconducting elements capable of supporting Gunn-effect domains;
    a cathode and an anode, common to all said semiconducting elements, connecting said semiconducting elements in parallel;
    means for sequentially creating a dipole domain in each of said semiconducting elements during a time substantially less than or equal to the shortest transit time of a dipole domain between said cathode and said anode for any of said semiconducting elements; and
    a voltage means capable of making the electric field within each semiconducting element exceed that element's Gunn threshold field, and further capable of maintaining the electric field at a level greater than that element's sustaining field.

* * * * *